(12) United States Patent
Featherby et al.

(10) Patent No.: US 6,455,864 B1
(45) Date of Patent: Sep. 24, 2002

(54) METHODS AND COMPOSITIONS FOR IONIZING RADIATION SHIELDING

(75) Inventors: Michael Featherby, San Diego; David J. Strobel, Poway; Phillip J. Layton; Edward Li, both of San Diego, all of CA (US)

(73) Assignee: Maxwell Electronic Components Group, Inc., San Diego, CA (US)

( * ) Notice: Subject to any disclaimer, the term of this patent is extended or adjusted under 35 U.S.C. 154(b) by 0 days.

(21) Appl. No.: 09/727,717

(22) Filed: Nov. 30, 2000

Related U.S. Application Data

(63) Continuation of application No. 09/375,881, filed on Aug. 17, 1999, now Pat. No. 6,261,508, which is a continuation of application No. 08/791,256, filed on Jan. 3, 1997, now abandoned, which is a continuation-in-part of application No. 08/372,289, filed on Jan. 13, 1995, now Pat. No. 5,635,754.
(60) Provisional application No. 60/021,354, filed on Jul. 8, 1996.

(51) Int. Cl.$^7$ .............................. G21F 3/00; G21F 1/12; H01L 23/552
(52) U.S. Cl. ................. 250/515.1; 250/519.1; 252/478; 428/323; 428/328; 257/659; 257/660
(58) Field of Search ............ 250/519.1, 515.1; 252/478; 428/323, 328; 257/659, 660

(56) References Cited

U.S. PATENT DOCUMENTS

| | | | |
|---|---|---|---|
| 3,706,840 A | 12/1972 | Moyle et al. | 174/52 PE |
| 3,771,025 A | 11/1973 | Berner | 317/234 R |
| 3,828,425 A | 8/1974 | Manus | 29/590 |
| 3,895,143 A | * 7/1975 | Tarlow | 250/515.1 |
| 3,914,858 A | 10/1975 | Sonoda et al. | 29/588 |

(List continued on next page.)

FOREIGN PATENT DOCUMENTS

| | | | |
|---|---|---|---|
| EP | 0160327 | 11/1985 | ............. 250/515.1 |
| FR | 2584863 | 1/1987 | |
| JP | 098846 | 7/1980 | |
| JP | 56103452 | 8/1981 | ................ 257/660 |
| JP | 57095650 | 6/1982 | |
| JP | 60106150 | 6/1985 | |
| JP | 60124834 | 7/1985 | |
| JP | 60180150 | 9/1985 | ................ 257/660 |
| JP | 61004249 | 1/1986 | ................ 257/659 |
| JP | 61004250 | 1/1986 | |
| JP | 62125651 | 6/1987 | ................ 257/660 |
| JP | 2237053 | 9/1990 | ................ 257/659 |
| JP | 2278740 | 11/1990 | |
| JP | 4094560 | 3/1992 | ................ 257/660 |
| JP | 4273200 | 9/1992 | |

OTHER PUBLICATIONS

"Electronics Packaging and Production", p 26–27.
"Electronic materials and Processes, Consulting and Short Courses", p 1–3.
"Electronic Materials Handbook", p 470–483.
"Electronic Packaging and Interconnection Handbook", p6.41–6.49.
M.P. Baze et al., "Latch–Up Paths in Pipolar Intergrated Circuits", IEEE Transactions on Nuclear Science, Dec. 1986, vol. NS–33. No. 6.

(List continued on next page.)

*Primary Examiner*—Jack Berman
(74) *Attorney, Agent, or Firm*—Fitch, Even, Tabin & Flannery

(57) ABSTRACT

The radiation shielding composition and method of the present invention relate to a conformal coating material composed of a matrix of densely packed radiation shielding particles, which are disbursed within a binder. The shielding composition is applied to objects to be protected such as integrated circuits, or to packages therefor, as well as for protecting animals including humans from unwanted exposure to radiation in outer space or other environments.

9 Claims, 10 Drawing Sheets

U.S. PATENT DOCUMENTS

| | | | | |
|---|---|---|---|---|
| 4,089,575 A | 5/1978 | Grabbe | ......................... | 339/17 |
| 4,091,407 A | 5/1978 | Williams et al. | ............... | 357/54 |
| 4,100,675 A | 7/1978 | Landsittel | ..................... | 29/627 |
| 4,173,683 A | 11/1979 | Comizzoli | .................. | 428/447 |
| 4,250,347 A | 2/1981 | Fierkens | ....................... | 174/52 |
| 4,468,411 A | 8/1984 | Sloan et al. | .................... | 427/8 |
| 4,494,217 A * | 1/1985 | Suzuki et al. | .................. | 365/53 |
| 4,506,108 A | 3/1985 | Kersch et al. | ................. | 174/52 |
| 4,633,573 A | 1/1987 | Scherer | ....................... | 29/589 |
| 4,652,465 A | 3/1987 | Koto | .......................... | 427/216 |
| 4,661,837 A | 4/1987 | Sono | ........................... | 357/84 |
| 4,663,240 A | 5/1987 | Hajdu et al. | ................. | 428/545 |
| 4,687,622 A | 8/1987 | Longden | ...................... | 376/254 |
| 4,769,344 A | 9/1988 | Sakai et al. | .................. | 437/216 |
| 4,833,334 A | 5/1989 | Valy et al. | ................. | 250/515.1 |
| 4,835,120 A | 5/1989 | Mallik et al. | ................ | 437/209 |
| 4,837,448 A | 6/1989 | Banchelin et al. | ........ | 250/519.1 |
| 4,839,716 A | 6/1989 | Butt et al. | ...................... | 357/74 |
| 4,888,449 A | 12/1989 | Crane et al. | ................ | 174/52.4 |
| 4,891,687 A | 1/1990 | Mallik et al. | .................. | 357/70 |
| 4,935,174 A | 6/1990 | Suzuki | ......................... | 264/24 |
| 4,953,002 A | 8/1990 | Nelson et al. | ................ | 357/74 |
| 4,967,315 A | 10/1990 | Schelhorn | ................... | 361/424 |
| 4,975,762 A | 12/1990 | Stradley et al. | ............. | 257/660 |
| 4,979,019 A | 12/1990 | Paquette et al. | ............ | 257/690 |
| 5,047,260 A | 9/1991 | Durand | ...................... | 427/54.1 |
| 5,096,851 A | 3/1992 | Yamazaki et al. | .......... | 437/205 |
| 5,138,430 A | 8/1992 | Gow, 3rd et al, | ............. | 357/70 |
| 5,139,969 A | 8/1992 | Mori | .......................... | 437/183 |
| 5,149,662 A | 9/1992 | Eichelberger | .................. | 437/8 |
| 5,151,770 A | 9/1992 | Inoue | .......................... | 357/53 |
| 5,166,772 A | 11/1992 | Soldner et al. | ............. | 257/659 |
| 5,180,513 A | 1/1993 | Durand | .................... | 252/62.55 |
| 5,202,536 A | 4/1993 | Buonanno | .............. | 174/35 GC |
| 5,206,794 A | 4/1993 | Long | ........................... | 257/675 |
| 5,239,126 A | 8/1993 | Oshiba | ........................ | 174/35 |
| 5,250,845 A | 10/1993 | Runyan | ....................... | 357/729 |
| 5,268,331 A | 12/1993 | Abbott | ........................ | 437/225 |
| 5,294,826 A | 3/1994 | Marcantonio et al. | ...... | 257/659 |
| 5,304,750 A | 4/1994 | Schubert et al. | ............ | 181/294 |
| 5,317,107 A | 5/1994 | Osorio | ....................... | 174/52.4 |
| 5,384,477 A | 1/1995 | Bulucea et al. | ............. | 257/372 |
| 5,406,117 A | 4/1995 | Dlugoecki et al. | .......... | 257/659 |
| 5,424,251 A | 6/1995 | Sono et al. | ................. | 437/214 |
| 5,441,900 A | 8/1995 | Bulucea et al. | ............... | 437/24 |
| 5,527,742 A | 6/1996 | Weiler et al. | ............... | 437/211 |
| 5,552,338 A | 9/1996 | Kang | ......................... | 437/170 |
| 5,561,265 A | 10/1996 | Livshits et al. | ........ | 174/35 GC |
| 5,577,319 A | 11/1996 | Knecht | ........................ | 29/827 |
| 5,589,129 A | 12/1996 | Kato et al. | ................... | 264/437 |
| 5,610,443 A | 3/1997 | Inagaki et al. | ............. | 257/788 |
| 5,672,918 A | 9/1997 | Kimbrough et al. | ........ | 307/126 |
| 5,714,102 A | 2/1998 | Highum et al. | ............. | 264/105 |
| 5,770,304 A | 6/1998 | Nakamura | .................. | 428/328 |
| 5,780,163 A | 7/1998 | Camilletti et al. | .......... | 428/446 |
| 5,824,568 A | 10/1998 | Zechman | .................... | 438/112 |
| 5,825,042 A | 10/1998 | Strobel et al. | ........... | 250/515.1 |
| 5,851,852 A | 12/1998 | Ostop et al. | ................. | 438/106 |
| 5,864,088 A | 1/1999 | Sato et al. | ..................... | 174/35 |
| 5,880,403 A | 3/1999 | Czajkowski et al. | ...... | 174/35 R |
| 5,888,850 A | 3/1999 | Havens et al. | .............. | 438/127 |
| 5,889,316 A | 3/1999 | Strobel et al. | .............. | 257/659 |

OTHER PUBLICATIONS

A. H. Johnston, et al., "The Effect of Temperature on Single–Particle Latch–Up", IEEE Transactions on Nuclear Science, Dec. 1991, vol. 38, No. 6.

Song et al., "Parametric Investigation of Latch–Up Sensitivity in 1.25 $\mu$m CMOS Technology", IEEE Transactions on Nuclear Science, Dec. 1987, vol. NS–34 No. 6.

* cited by examiner

METHODS AND COMPOSITIONS FOR IONIZING RADIATION SHIELDING

CROSS-REFERENCE TO RELATED APPLICATIONS

This is a continuation of prior application number 09/375,881, filed Aug. 17, 1999 of Featherby, et al., for "METHOD FOR MAKING A SHIELDING COMPOSITION", now U.S. Pat. No. 6,261,508; which is a continuation of U.S. Ser. No. 08/791,256, for "METHODS AND COMPOSITIONS FOR IONIZING RADIATION SHIELDING", filed Jan. 30, 1997, of Featherby, et al., which claims priority to U.S. Provisional Application No. 60/021,354, filed Jul. 8, 1996, all of which are incorporated herein by reference.

This is a continuation of prior application number 09/375,881, filed Aug. 17, 1999 of Featherby, et al., for "METHOD FOR MAKING A SHIELDING COMPOSITION", now U.S. Pat. No. 6,261,508; which is a continuation of U.S. Ser. No. 08/791,256, for "METHODS AND COMPOSITIONS FOR IONIZING RADIATION SHIELDING", filed Jan. 30, 1997, of Featherby, et al., which is a continuation-in-part of U.S. Ser. No. 08/372,289, for "RADIATION SHIELDING OF INTEGRATED CIRCUITS AND MULTI-CHIP MODULES IN CERAMIC AND METAL PACKAGES", filed Jan. 13, 1995 of Strobel, et al., now U.S. Pat. No. 5,635,754; which is a continuation-in-part of U.S. Ser. No. 08/221,506, for "RADIATION SHIELDING OF PLASTIC INTEGRATED CIRCUITS", filed Apr. 1, 1994 of Strobel, et al., all of which are incorporated herein by reference.

TECHNICAL FIELD

The present invention relates in general to a radiation shielding coating composition and a method of making and using it. The invention more particularly relates to compositions and methods for shielding microelectronic devices and other objects and animals, with a radiation hardened light weight coating for withstanding the radiation hazards found in the space environment, as well as other less hazardous environments.

BACKGROUND ART

Many of today's commercial integrated circuit (IC) devices and multi-chip modules (MCM) cannot be utilized in deep space and earth orbiting applications because of total dose radiation induced damage. Commercial IC devices are developed and manufactured for computer and mass market applications and are not designed to withstand the effects of the natural space environment. The radiation effects include solar flares, galactic cosmic radiation and the Van Allen trapped electron and proton belts or man-made radiation induced events (neutrons and gamma radiation).

Typical commercial silicon integrated circuits fail to operate when exposed to total doses of two to fifteen kilorads(Si). Common methods used to prevent radiation degradation in performance are: 1) to design special radiation tolerant die, 2) to shield the entire component and board assembly, or 3) shield the individual component. There are weight, cost and time-to-market penalties depending on the method. For example, specially designed radiation tolerant die are time consuming and expensive to produce, since the part must be redesigned to incorporate radiation hardening techniques. Examples of such methods include U.S. pat. Nos. 3,933,530; 4,014,772; 4,148,049; 4,313,7684; 4,402,002; 4,675,978; 4,825,278; 4,833,334; 4,903,108; 5,001,528; 5,006,479; 5,024,965; 5,140,390; 5,220,192; and 5,324,952, each of which patent is incorporated herein by reference. Reference may also be made to Japan patent 62-125651, Jun. 6, 1987, and articles entitled "Effects of Material and/or Structure on Shielding of Electronic Devices," R. Mangeret, T. Carriere, J. Beacour, T. M. Jordan, IEEE 1996; and "Novice, a Radiation Transport/Shielding Code", T. M. Jordan, E. M. P. Consultants Report, January 1960, the Japan patent and such articles being incorporated herein by reference.

Such techniques delay the time to market the products. As a result, these conventional radiation hardened devices are usually two to three generations behind the current commercial technological advances in both size and capabilities. There are additional penalties in limited marketability and demand, and hence low volume productions of the die result. Consequently, such methods produce a more expensive product, which is technologically behind the commercially available microelectronics, with slower speed and less capability. Additionally, because of the limited market for these products, they are frequently not available at all.

Such radiation shielding methods involve using metal shielding external to the package. Shielding by other mechanical or electrical elements complicates the platform design, often requiring complex three dimensional modeling of the design.

Another attempt at shielding includes disposing a small shield on the surface of the package. Such a technique does not provide effective three-dimensional shielding protection. Additionally, the small external shield is generally thermally mismatched to the package, and increases the size and weight of the package.

Examples of system level shielding are disclosed in U.S. Pat. Nos. 4,833,334 and 5,324,952, which are incorporated by reference as if fully set forth herein. The U.S. Pat. No. 4,833,334 discloses the use of a protective box to house sensitive electronic components. The box is partially composed of a high atomic weight material to shield effectively against x-rays. However this approach has the serious disadvantage of adding substantial bulk and weight to electronic circuit assemblies protected in this manner. Moreover, it would be expensive to provide this type of protection to individual integrated circuits as manufacturing custom boxes for each circuit configuration would be costly.

The method of shielding material on the outside of the package is known as spot shielding. Such a technique is disclosed in Japanese patent publication 62-125651, published Jun. 6, 1987, which is incorporated by reference as if fully set forth herein. This patent describes a spot shielded semiconductor device which utilizes a double layered shield film to serve as a sealing cover on an upper surface of a semiconductor package. Another double layered shield film is attached to a lower surface of the package. However, space qualified microelectronic parts must be capable of withstanding the enormous forces exerted during acceleration periods during space travel. The external shields are subject to tearing or prying off from the sealing cover. The use of a double layer shield film only slightly reduces the weight of the package, but increases the size of the package unnecessarily. Also, thin films are generally only effective at shielding electromagnetic interference (EMI) radiation and are ineffective at shielding ionizing radiation found in space. Examples of this type of EMI or EMF shielding devices include devices disclosed in U.S. Pat. Nos. 4,266,239; 4,823,523; and 4,868,716, which are incorporated herein by reference.

The significant disadvantage of the spot shielding method includes an increase in weight and thickness of the device, and an increase in exposure of the semiconductor to side angle radiation due to the shielding being spaced apart from the semiconductor.

A far superior method of shielding involves using an integrated shield, where the package itself is the shield. For example, reference may be made to said U.S. patent application Ser. No. 08/221,506, filed Apr. 1, 1994, entitled "RADIATION SHIELDING OF INTEGRATED CIRCUITS AND MULTI-CHIP MODULES IN CERAMIC AND METAL PACKAGES," now abandoned, which is incorporated herein by reference. The material in the package and the package design is optimized for the natural space radiation environment.

Many conventional microcircuits are only available in prepackaged form, or the die is already mounted onto the circuit board. Therefore, it would be highly desirable to have technique and shielding compositions for shielding parts already packaged or mounted on a circuit board, or in bare IC die form. Such compositions should be relatively inexpensive to manufacture and use, and are compact in size. In this regard, such new and improved techniques should be very convenient to employ in a highly effective manner, and yet be relatively inexpensive to manufacture.

SUMMARY OF THE INVENTION

The principal object of the present invention is to provide a new and improved composition and method of radiation shielding in outer space or other environments, whereby such shielding compositions and methods are highly effective and relatively inexpensive.

Another object of the present invention is to provide such a new and improved method and composition, wherein the radiation tolerance of the bare die to be shielded is greatly improved, and the shielding is provided in all axial directions.

A further object of the present invention is to provide such a new and improved method and composition, wherein satellite designers can utilize current generation IC technological advances, while improving delivery time.

A still further object of the present invention is to provide such a new and improved method and composition, wherein IC devices can be supplied relatively inexpensively due to the use of commercially available dies at current market prices without undue weight, excessive or bulky sizes or other undesirable or unwanted design requirements.

Yet another object of the present invention is to provide such a new and improved composition and method of radiation shielding for protecting other objects or animals from unwanted radiation.

Briefly, the above and further objects of the present invention are realized by providing shielding compositions and methods which are relatively inexpensive to use and highly effective in outer space and other environments.

The radiation shielding composition and method of the present invention relate to a conformal coating material composed of a matrix of densely packed radiation shielding particles, which are disbursed within a binder. The shielding composition is applied to objects to be protected such as integrated circuits, or to packages therefor, as well as for protecting animals including humans from unwanted exposure to radiation in outer space or other environments.

The inventive radiation shielding composition including the densely filled conformal coating material is used for commercially available integrated circuits or grouping of circuits, to protect against natural and man-made radiation hazards of the spacecraft environment, whether in earth orbit, geostationary, or deep space probes. The inventive composition and methods are provided to facilitate the design and manufacture of microelectronics, and to coat externally the microelectronics with the inventive shielding composition to improve radiation tolerance to natural space radiation.

The inventive shielding composition, in one form of the invention, includes a fabric and a flexible binder, used to shield animals including humans in space or in other environments. As humans prolong their stay in space, the risks from increased exposure to ionizing radiation become more of a concern. The conventional method of shielding using lead has two major disadvantages. Lead is highly toxic, which is a disadvantage in both manufacture and use. Lead is also relatively less dense. With the inventive composition, the same equivalent shielding can be obtained with a thinner high Z material such as tungsten. By using a denser material, a thinner shield can be constructed, making movement relatively easier. Since sources of radiation are not limited to space, this same material has utility to shield humans or other animals from radiation sources on earth.

The limiting factor is weight, and the energy and species of radiation. Thin densely packed shields are not very effective on high energy electromagnetic radiation such as gamma rays, and high energy neutrons.

Additionally, the inventive conformal coating composition and method are useful as a radiation shielding gasket between enclosures. There are many radiation shielding utilities for the inventive compositions and methods, depending on the choice of the binder material.

The present inventive methods and compositions contemplate using both plastic or ceramic packaged microelectronic devices, as well as unpackaged die and encapsulating or coating the outer surface of the device to provide shielding as required for the anticipated radiation environment. Since fluences of species and energy ranges of radiation vary in space, and since the optimal shielding varies depending on the species of radiation, the coating substance or material can be optimally tailored based on the anticipated radiation that irradiates the part to be protected. In all applications, the particles impregnated within the conformal coating substance are designed to achieve the highest tap density possible for the application.

The present inventive method preferably includes calculating/modeling the anticipated radiation spectrum, the required amount of shielding, as well as multiple layers of both high Z and low Z shielding material. The inventive conformal coating substance or material is then designed to meet that requirement. For a standard Geosynchronous Orbit, the optimum shielding entails a conformal coating having three layers; namely, a high Z layer sandwiched between two low Z layers. For marking and hermiticity, a layer of smooth unimpregnated coating material is applied to the top layer.

For integrated circuit devices that have already been packaged, the inventive conformal coating material can be applied in various manners. These include, but are not restricted to, the following inventive methods. One method relates to using a low pressure (or high pressure depending on the package strength and susceptibility) injection mold. The coating material is injected into a mold containing the packaged part. Another method involves "globbing" or putting a viscous conformal coating over a packaged part. The part can be disposed within a mold, or elsewhere when the shielding composition is applied. Another method involves spraying or painting on the coating composition. The optimum method is to coat all sides of the part uniformly with the shielding composition to shield all sides equally from isotropic radiation, and especially when the direction of the source of radiation is not known.

For integrated circuits already attached to a board, either in a bare die form or with an existing coating, the coating is applied with a mold, by "globbing" the composition on, by spraying or painting. To shield the top and bottom sides of the die uniformly, the bottom of the board preferably is also shielded with the inventive conformal shielding composition.

For multi-chip modules (MCMs) where there are multiple integrated circuits within a single package, the inventive conformal coating composition is applied in a similar manner as in the monolithic packaged integrated circuit. Similarly, when there are multiple bare- integrated circuits, the inventive conformal coating composition is applied in a similar manner as with the single bare integrated circuit, wherein the coating composition is applied to the entire area covered by the devices to be shielded.

For system or boxes containing board level products requiring additional shielding, the inventive conformal coating composition can also be applied to any box or device to be shielded from ionizing radiation. In this manner, with the use of a flexible binder material such as latex, a gasket can be made for sealing two objects, wherein the inventive gasket material also provides a radiation shielding function.

Because of the flexibility of the inventive shielding composition, radiation shielding can be achieved easily and relatively inexpensively for applications that were either previously considered to be excessively expensive or difficult to shield.

For human radiation protection, the inventive composition conformal coating include a latex or similar flexible binder. To enhance the mechanical strength properties, a fabric material is added and combined with the binder. In this form of the invention, a high Z material, which is dense and nontoxic, can be inserted within the layers of clothing material to add extra protection for the wearer from unwanted radiation. Because of weight considerations, the optimal shielding can be obtained in the weightless environment of space. Lighter, thinner material is used for gravity constrained environments. Additionally, the impregnating particles can be tailored for the type of radiation to be encountered, enabling optimal use of space and weight of the material.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
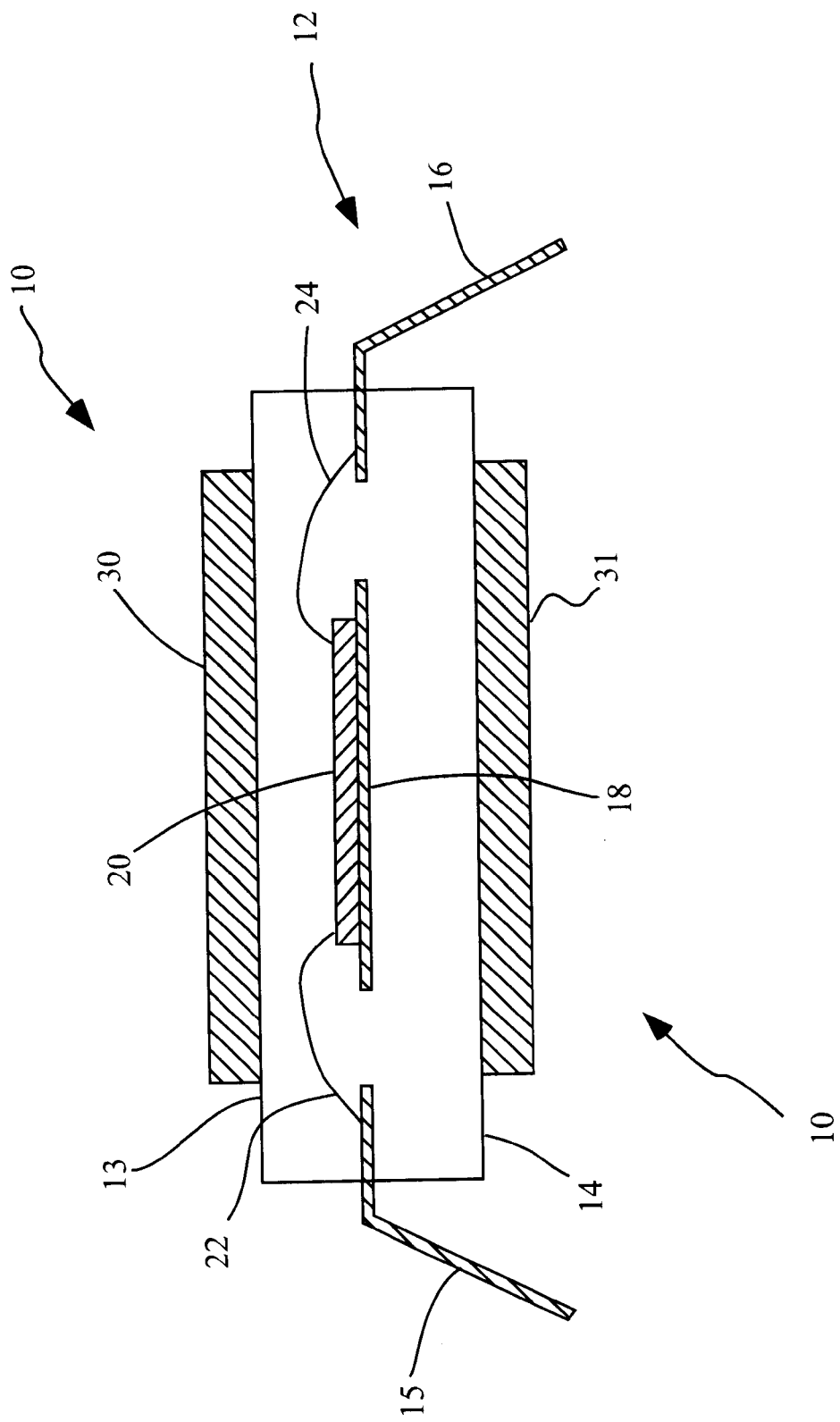
FIG. 1 is a diagrammatic sectional side view of a prior art spot shielded prepackaged integrated circuit.

The following description is of the best mode presently contemplated for practicing the invention. This description is not to be taken in a limiting sense, but is made merely for the purpose of describing the general principles of the invention. The scope of the invention should be ascertained with reference to the issued claims. In the description that follows, like numerals or reference characters will be used to refer to like parts or elements throughout.

Figure 2A:
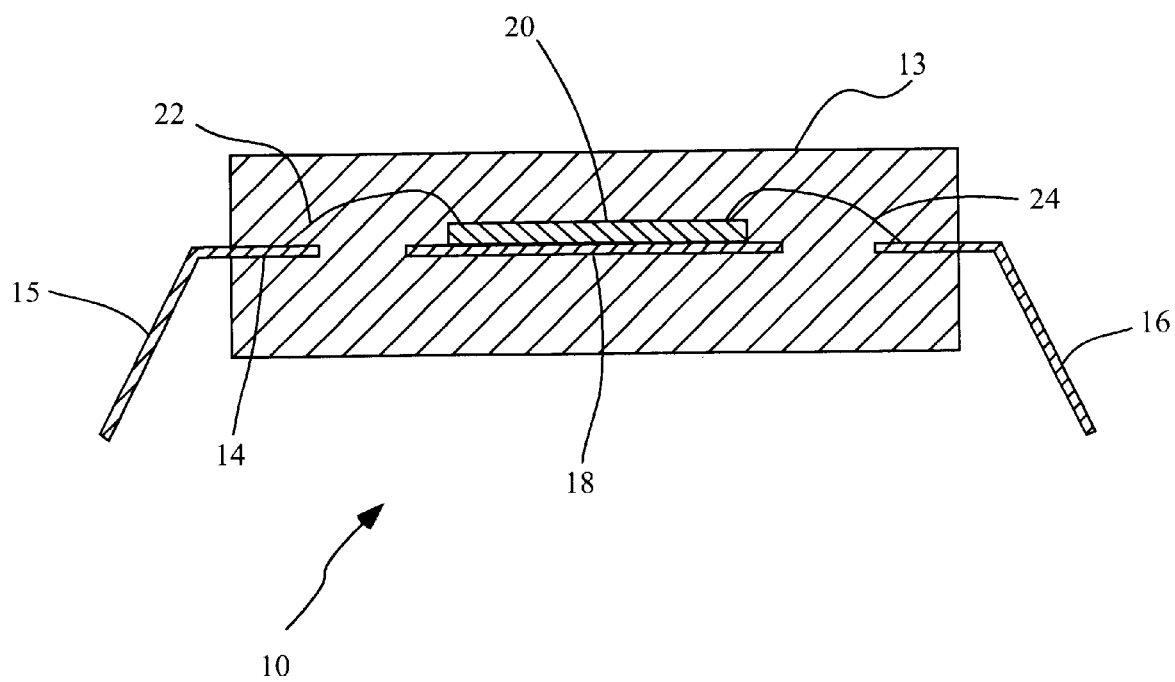
FIG. 2A is a diagrammatic sectional side view of a conventional unshielded commercial package assembly.
Figure 2B:
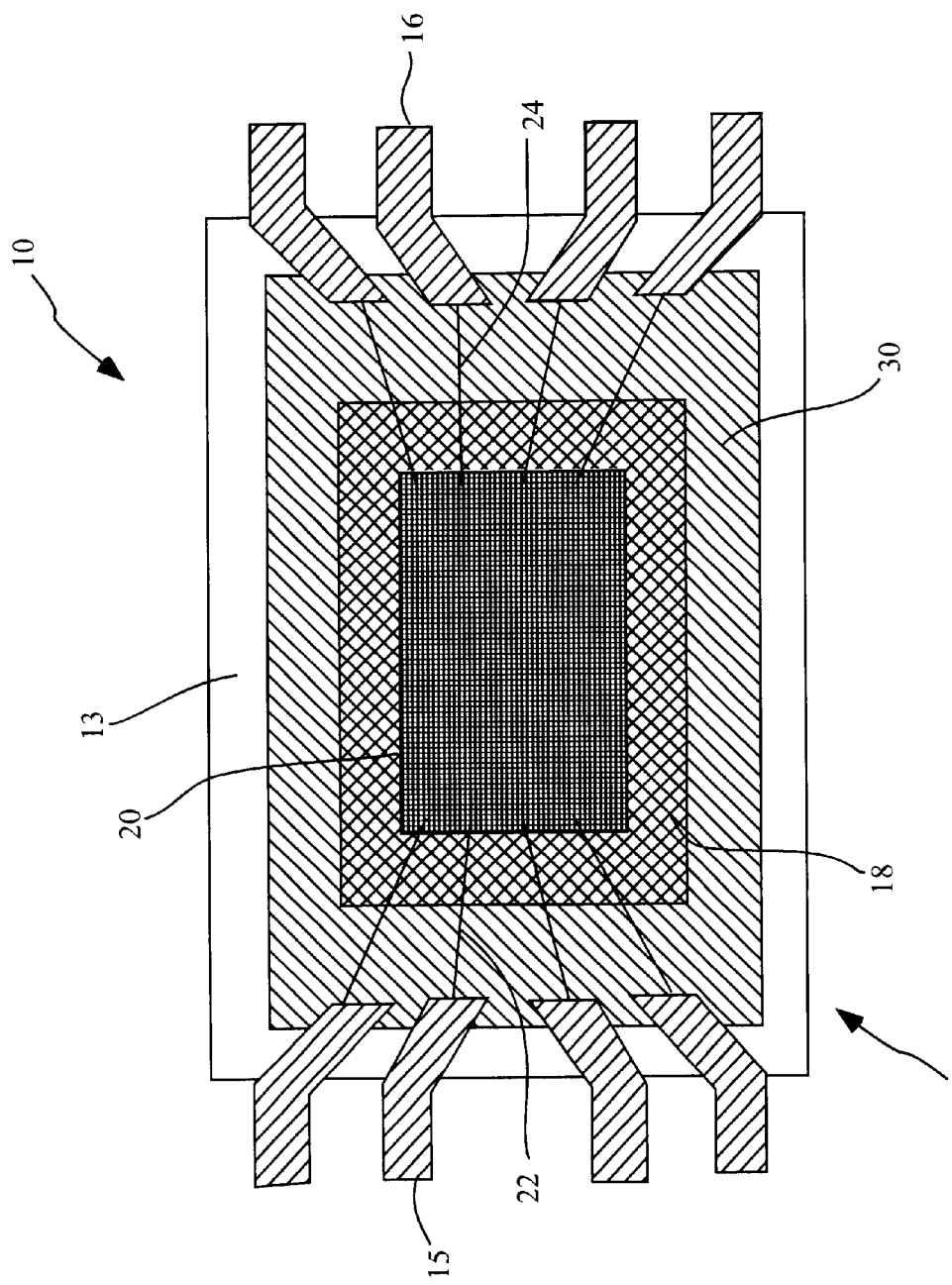
FIG. 2B is a diagrammatic top view of the package assembly of FIG. 2A.

Referring now to the drawings, and more particularly to FIGS. 1, 2A and 2B, there is shown a commonly used conventional microelectronic package 10, which is a plastic package. FIG. 1 illustrates the package 10 with a spot shield attached. The packages are comprised of a die 20, which is composed of silicon or other semiconductor base. The die is generally attached to a die attach pad 18 for support. The die is then bonded with multiple lead wires 22, 24 to a lead frame with multiple leads 15, 16. This entire assembly is encased within a package 13 composed of suitable plastic material or other material such as ceramic.

Figure 3:
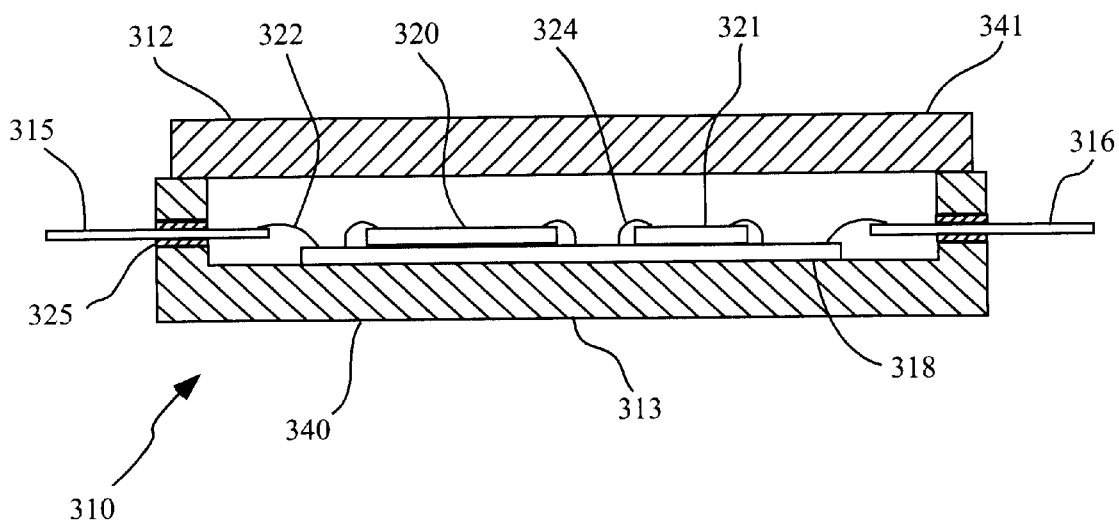
FIG. 3 is a diagrammatic sectional side view of a prior art module with multiple integrated circuit devices shielded therewithin.

If thermal conductivity properties are important considerations, other materials such as ceramics are used, as shown in FIG. 3, these are more difficult to work with and can be conducting, necessitating an insulating feed through 25 to cover the leads 15, 16.

A conventional method for shielding these packages is shown in FIG. 1, where a pair of shielding plates 30 and 31, usually made of a high Z material such as tantalum, is attached to the top and bottom portions of the package 13 respectively by a suitable adhesive (not shown).

As shown in FIG. 3, another prior art technique relates to the use of integrated shielding technology, where the package itself, is part of the shielding. FIG. 3 shows the integrated shielding package 310 that also incorporates multiple die 320 and 321. The multiple die 320 and 321 on a die attach pad 318 employ multiple lead wires 322 and 324, together with a lead frame with multiple leads 315 and 316 and an insulating feed through 325, for a package 313. This type of package is called an MCM or Hybrid package. With multiple die within the package, the density of functions increases, while the overall weight required to accomplish the task is reduced. This type of packaging requires base members 340 and 341, which can be made of various shielding materials. For ionizing radiation, high Z materials can be used, enabling the package itself to become the radiation shielding.

Figure 4:
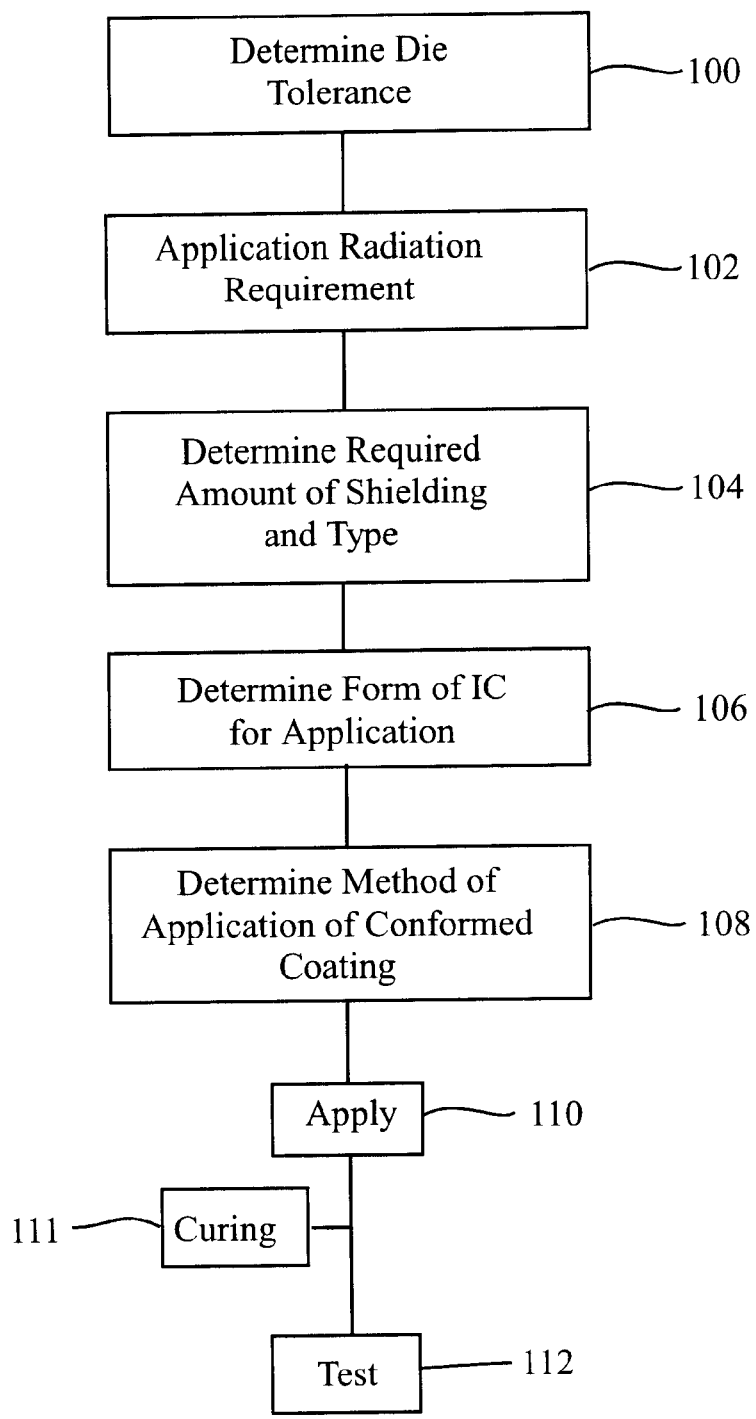
FIG. 4 is a flow chart illustrating a radiation shielding method according to the present invention.

As shown in FIG. 4, the inventive method includes, as indicated in box 100, determining the inherent radiation tolerance of the die to be shielded. This test can be accomplished by a Cobalt-60 source or other penetrating irradiation source. Without the knowledge of what the inherent radiation tolerance is for the individual semiconductor device, the designer does not know how much or whether shielding is necessary.

Figure 5:
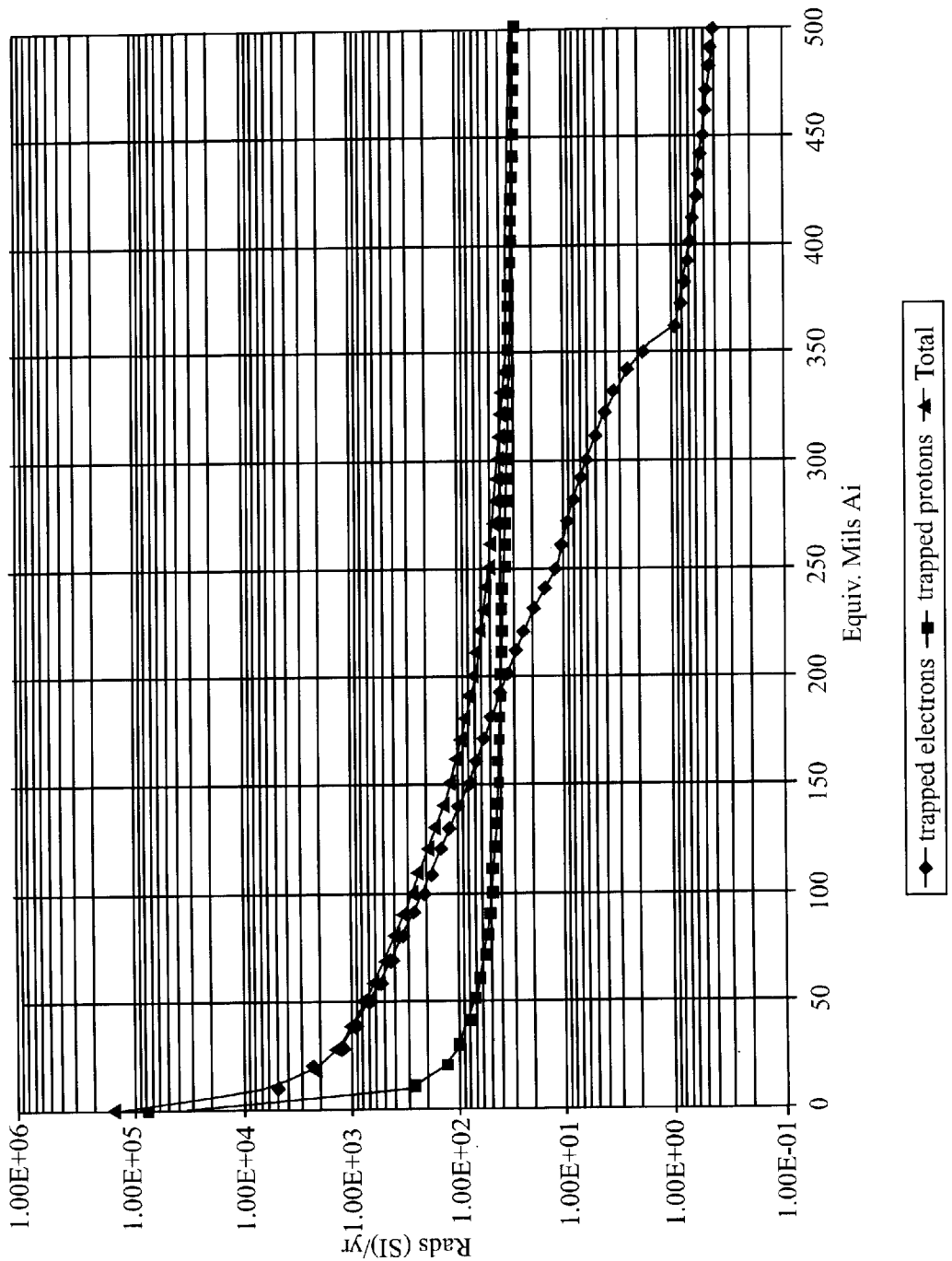
FIG. 5 is a graph of a typical total dose versus depth curve, useful in understanding the present invention.

The next step as indicated at 102 involves determining the radiation spectrum and dose depth curve of the particular mission or radiation requirement of the application. For orbits around the earth, this is calculated using conventional radiation transport codes in conjunction with conventional radiation spectrum tables. The dose depth curve is generally represented as a total radiation dose versus thickness of equivalent aluminum shielding as shown in FIG. 5. Although not preferred, steps indicated at 100 and 102 can be omitted if the application is unknown and the designer desires only to enhance whatever the radiation tolerance of the integrated circuit to be protected.

Knowing the inherent radiation tolerance of the integrated circuit device, as indicated at 100 and the dose depth curve as indicated at 102, the amount of shielding required can be determined to bring the integrated circuit device within tolerance as indicated at 104.

Knowing the spectrum of radiation for the application, the layering of the inventive shielding material is tailored as hereinafter described in greater detail with reference to FIG. 8. High Z material is more effective at stopping electrons and Bremsstrahlung radiation, and less effective in stopping protons. Low Z material conversely is more effective at stopping protons and less effective at stopping electrons and Bremsstrahlung radiation.

The next step, as indicated at 106, requires determining the form of the integrated circuit. For a prepackaged part, the amount of shielding is limited by the lead length on the bottom of the device, unless extenders are used. The most appropriate method of application of the inventive shielding composition is then determined as indicated at 108. The part is coated in a mold (not shown), using a dam. (not shown), and the coating can be globbed, sprayed, injected or painted on. For die that are already mounted on the board (not shown), the methods mentioned above are effective, but to insure uniform radiation shielding, the bottom of the board underneath the part is also coated with the same thickness of the inventive shielding composition. The coating material is applied as indicated at 110 and then allowed to cure as indicated at 111. Temporary extenders are preferably used to provide thorough wetting throughout the binder. As an example, a preferred extender for epoxy is a high boiling point ketone.

Additionally, by adjusting the properties of the binder, the bulk electrical properties of the shield composition is-adjusted to be either insulating or conductive.

Upon completion of coating the parts, testing is then performed electrically and mechanically, as indicated generally at 112. For space applications, the parts require space qualification testing.

There are various different methods of application of the inventive shielding composition as contemplated by the invention and as indicated in FIGS. 5, 6, 7 and 8. However, the following examples are intended to be representative and not all inclusive of the possible application methods falling within the scope of the present invention.

Figure 6:
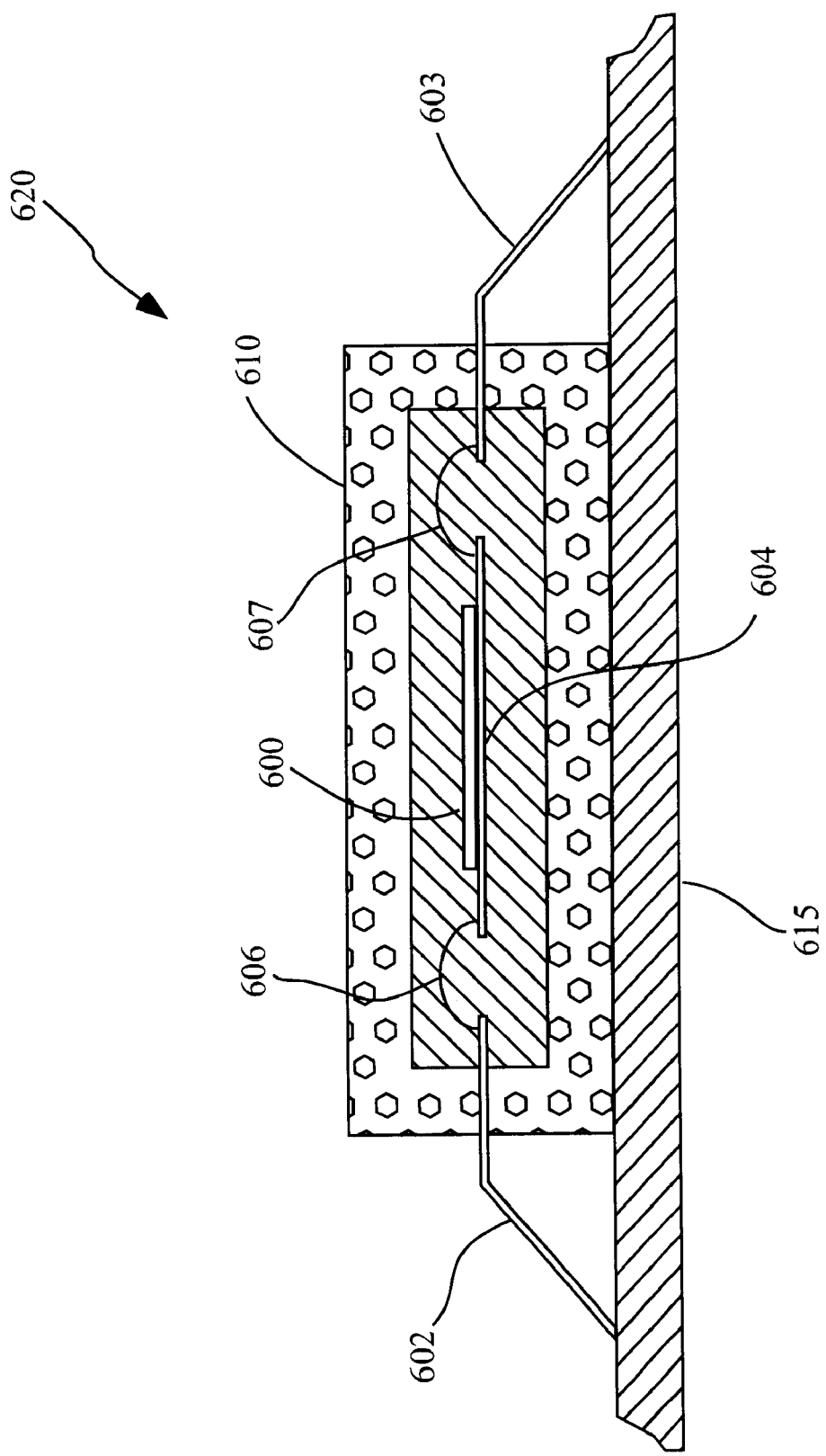
FIG. 6 is a diagrammatic sectional side view of a shielding composition applied to a conventional package in accordance with the present invention.

Referring now to FIG. 6, a coating method of the present invention is illustrated for a die 600 attached to a substrate 604. It should be understood that a multiple die device, such as the one shown in FIG. 3, may also be protected as will become apparent to those skilled in the art.

The die is wire bonded at 606 and at 607 to lead frame devices 602 and 603, respectively, to complete electrical connections between the die and systems (not shown) outside of the package. A radiation shielding conformal coating composition is applied to the outside of the package 610. The package can then be applied to a board 615 or any other attachment system by any suitable conventional technique.

The radiation shielding conformal coating composition 610 is applied uniformly on the outer surface of the package to insure uniform radiation protection in accordance with the present invention. The coating can be applied by injection molding, mold casting, spraying, globbing or brushing the material onto the part to be protected.

Figure 7:
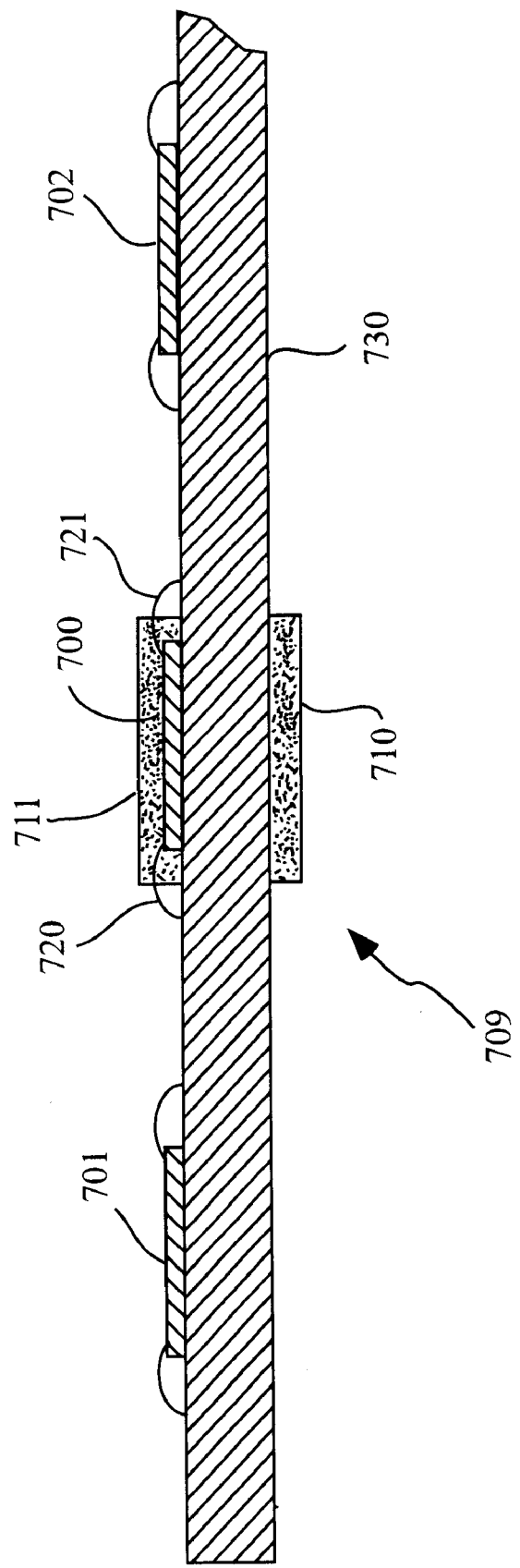
FIG. 7 is a diagrammatic sectional side view of a shielding composition applied to a conventional chip-on board in accordance with the present invention.

Referring now to FIG. 7, another method of application according to the invention includes applying the radiation shielding conformal coating composition generally indicated at 709 to an integrated circuit device 700 previously attached to a board 730. The board 730 may have other devices such as a pair of devices 701 and 702 not requiring protection. The device 700 is attached to the board via wire bonds 720 and 721. The radiation shielding conformal coating composition 709 is then applied both on top of the device 700 at 711 and directly underneath the device 77 at 710 on the board 730.

An area greater than the size of the device 700 is covered with radiation shielding conformal coating composition 710 on the bottom of the board 730. This is required to insure that the entire integrated circuit device is protected from radiation.

The radiation shielding conformal coating composition 709 is applied by the same method as described in connection with the inventive method of FIG. 6.

Figure 8:
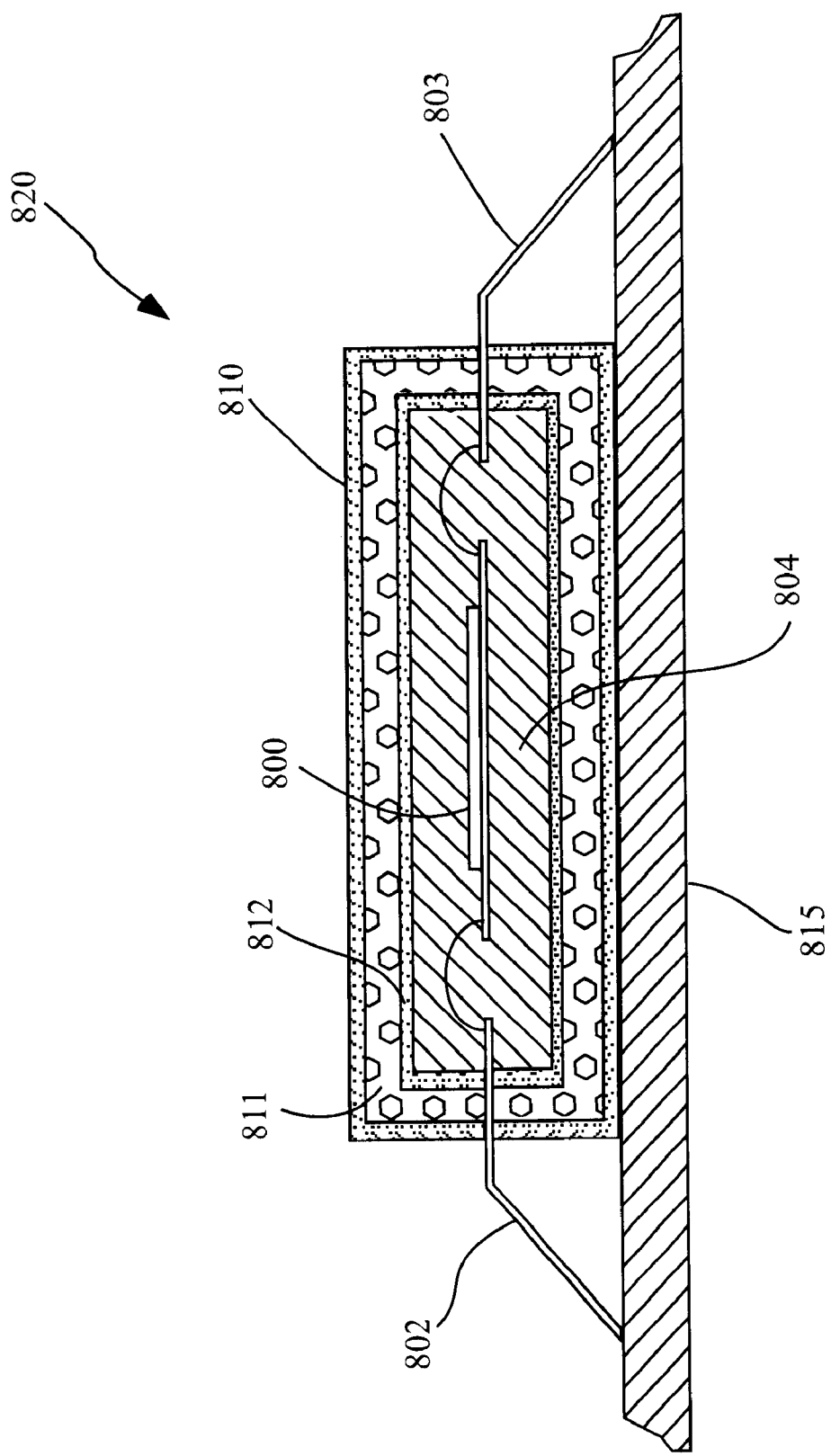
FIG. 8 is a diagrammatic sectional side view of a multi-layered conformal coating of shielding composition applied to a conventional integrated circuit package in accordance with the present invention.

Referring now to FIG. 8, to enhance radiation shielding performance, multiple layers of the inventive radiation shielding conformal coating composition are applied. Using conventional codes such as NOVICE, different shielding layering are developed for each type of orbit. An optimum shielding geometry for a Geosynchronous Orbit is shown in FIG. 8.

As shown in FIG. 8, in accordance with the present invention, a die 800 having an integrated circuit package 804 containing lead frame devices 802 and 803 is encased within a multiple layer radiation shielding composition generally indicated at 820, prior to mounting the shielded die to a board or substrate 815. The multiple layer shielding composition 820 comprises a layer of high Z particles 811 interposed between a pair of outer and inner layers of low Z particles 810 and 812. The low Z layer 812 is applied directly to the outer surface of the die 800 in accordance with the method described in connection with FIG. 6. Thereafter, the intermediate high Z layer 811 is then applied to the outer surface of the inner low Z layer 812.

The outer low Z layer 810 is then applied to the outer surface of the intermediate high Z layer 811 to complete the shielding protection for the die 800. The shielded die 800 is then connected electrically and mounted to the board 815 by conventional techniques.

The high Z material is effective in stopping electrons and Bremsstrahlung radiation, while the low Z material is more effective in stopping protons. A Geosynchronous orbit is dominated by trapped electrons, so it is preferable that the intermediate high Z layer 811, is thicker than the other two low Z layers. It will become apparent to those skilled in the art that the multiple layer coating method of the present invention can be used in connection with the protection of many different types and kinds of integrated circuit devices and the like. Additionally, the coating method can be applied by any method including, but not limited to, those described in connection with the method of FIG. 6.

Figure 9:
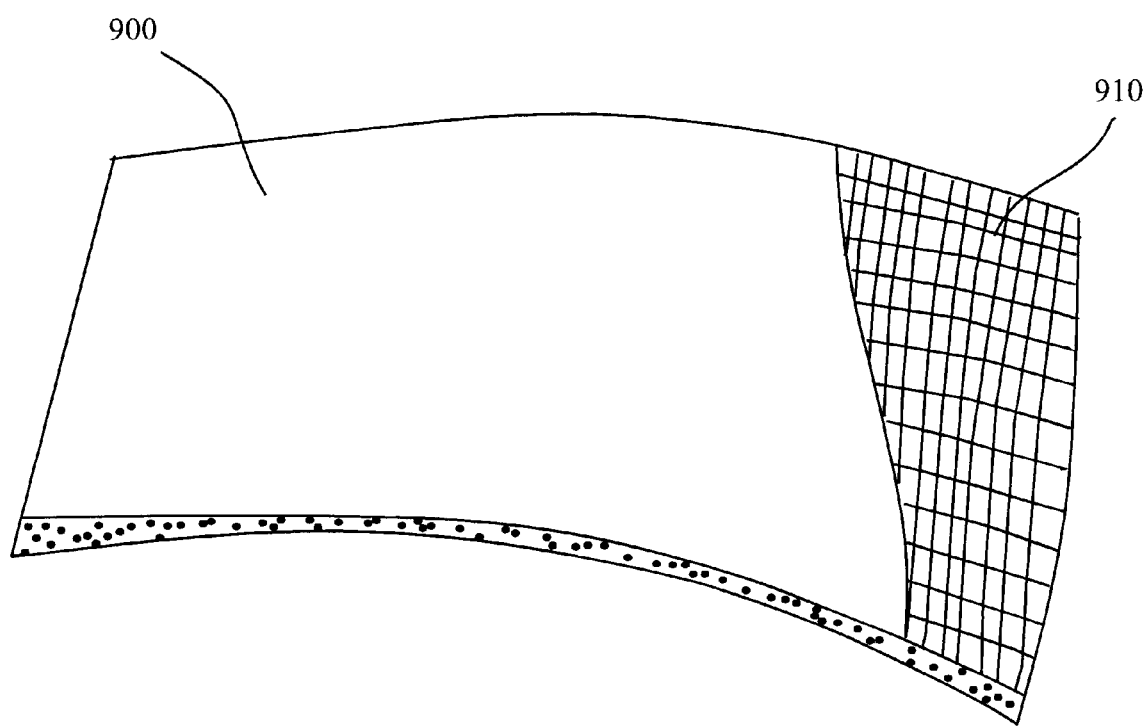
FIG. 9 is a pictorial, partially diagrammatic fragmentary view of a shielding composition used for animal radiation shielding in accordance with the present invention.

Referring to FIG. 9, there is shown a flexible shielding material, which is composed according to the present invention. The material 900 contains the inventive radiation shielding composition, and is flexible and pliable to serve as clothing for humans or gasket material for parts (not shown). The conformal coating material 900 includes a flexible binder such as latex. The material 900 is impregnated with a fabric such as a cloth woven material 910 for strength. The cloth material can be composed of conventional materials such as cotton or polyester. For extra strength, nonwoven fabric such as Kevlar or Teflon material can be used for the fabric.

Considering now the inventive radiation shielding composition forming a part of the foregoing inventive methods and materials, the following examples of shielding compositions are given to aid in understanding the invention, but it is to be understood that the particular procedures, conditions and materials of these examples are not intended as limitations of the present invention.

EXAMPLE I

| | |
|---|---|
| 10.0 parts by weight | high tap density tungsten powder |
| 0.15 part by weight | premixed epoxy |
| up to 0.50 part by weight | ketone |

The tungsten powder serves as a high Z material for radiation shielding purposes. The epoxy serves as a binder to help adhere the composition to a surface, and the ketone is added as an extender.

To formulate the inventive composition, the ingredients of Example I are mixed thoroughly, and then the mixture is applied to a part. The applied mixture is in the form of a paste, and is heated slowly at a suitable low temperature such as 40° C. for about one hour to remove a substantial portion of the ketone extender without disrupting the integrity of the packed tungsten powder. The mixture is then heated at about 60° C. for about 16 hours to retain the stability of the composition. The temperature is then increased to about 150° C. for an additional period of time of about 0.5 hours. The resulting mixture has the desired consistency of a paste, and retains its stability due to the foregoing multiple heating phases.

EXAMPLE II

In general, the ingredients of the present Example can be adjusted to-accommodate variations in the foregoing described inventive methods and applications.

The shielding powder can be any suitable high Z radiation shielding powder such as osmium, iridium, platinum, tantalum and gold. In general, any high Z material may be employed having an atomic number of 50 and above. More preferably, the range of atomic numbers can be between 60 and 100, inclusive. The most preferred range of atomic numbers is between 73 and 79, inclusive.

The shielding powder can also be a low Z material, such as the one mentioned in connection with the description of the inventive method of FIG. 8. The low Z shielding powder is preferably selected from the group consisting of copper, nickel, carbon, titanium, chromium, cobalt, boron, silicon, iron and nitrogen. In general, any suitable low Z material may be employed having an atomic number of 30 and below, but the most preferred group of low Z materials is selected from the group consisting of copper, nickel, carbon, iron, titanium, silicon and nitrogen.

In general, the shielding powder can be any suitable material composed of a matrix of densely packed shielding particles. The preferred material is tungsten (Example 1) having a packing density of at least 150 grn per cubic inch.

There can be between about 0.10 and about 0.50 parts by weight of a binder in the form of a suitable resin. The binder can be a urethane. The exact quantity of the binder determines the final density and strength of the shielding afforded by the inventive composition. A more preferred range of the binder is between about 0.13 and about 0.30.

Also, in general, the extender assures complete wetting of the powders and adjusts the viscosity of the paste to suit the application method.

EXAMPLE III

| | |
|---|---|
| 10.0 parts by weight | high tap density tungsten powder |
| 0.15 part by weight | premixed epoxy |
| up to 0.50 part by weight | latex |

This example of the inventive material may be used for the method described in connection with FIG. 9, wherein a fabric may be embedded therein for reinforcing purposes. Any suitable elastomer may be employed for the latex.

As shown and described in the accompanying provisional patent application in Appendix A, there is described and shown a further and more detailed disclosure of the inventive methods and compositions. In the Appendix A, the inventive radiation shielding composition is identified by the trademark "RADCOAT."

While particular embodiments of the present invention have been disclosed, it is to be understood that various different modifications are possible and are contemplated within the true spirit and scope of the appended claims. There is no intention, therefore, of limitations to the exact abstract or disclosure herein presented.

Outline of Ionizing Radiation Shielding of Microcircuits Using Filled Conformal Coatings This invention provides additional ionizing radiation resistance to virtually any sensitive electronic device, with or without a package. Specifically, resistance to total dose ionizing radiation can be enhanced by adding shielding to any device without modification to Its form or function. Additional shielding, particularly under the device could be accommodated if lead lengths could be Increased.

This invention utilizes a filled conformal coating in a versatile system that can apply high density material for localized shielding to many types of electronic components from exposed die to finished components mounted on a printed circuit board. It is suitable for low volume customized usage and does not require expensive tooling or equipment to implement The material is intended to provide easy application of a form of radiation shielding to existing electronic or other sensitive devices. The material developed here is essentially a (polymer or glassy) matrix highly loaded with dense (high specific gravity) particles. Tungsten (dispersed in epoxy) provides the most convenient, efficient and readily available radiologically dense material.

Selection of the of the most appropriate combinations of particle sizes and shapes can increase the loading of the composite to provide the maximum density of the composite while retaining the workability of the paste prior to curing. Selection of the polymer can provide optimum adhesion of the particles to each other and to the component being shielded and influences the compatibility, workability and the mechanical and electrical properties of the composite. Some polymers allow the composite to be electrically insulating even at the high loading desired for maximum density.

Spherical powders with a tap density of the order of 200 grams/cubic inch can produce composites with a specific gravity of 13 when mixed In the approximate ratio of 10 grams of powder to 0.15 grams of polymer. Fugitive solvents that are compatible with the chosen matrix can be added to ensure wetting of all the particles and satisfactory rheology of the paste. The rheology of the paste can be adjusted to suit the application (e.g. casting, molding, syringe or spray) and end use (e.g. bare die or mounted package). The polymer binder chemistry can also be varied to suit the application method.

Lower density pastes can be used if thicker coatings can be tolerated. This widens the range of particle sizes and morphologies that can be incorporated into the paste. The additional polymer can be beneficial in terms of rheology, adhesion, electrical and thermo-mechanical properties. The insulating nature of the shielding paste can be enhanced by precoating the powders or by precoating the component. Allowing the insulating paste to completely cover the component including the leads can improve the level of shielding. Depending on the rheology of the paste, the coating material can be built up by spray or spatulation or if a lower viscosity paste is used, a dam can be placed around the device until it has cured or solidified in place.

Section 1 The RADCOAT™ Concept

The concept for RADCOAT™ is based on RAD-PAK® and similar radiation hardening techniques which uses localized dense shields around a sensitive (electronic) device. Maximizing the density (specific gravity (S.G.)) of the shielding material, optimizes the efficiency of the shielding and minimizes the thickness and total mass of the shields. (Density and specific gravity are used interchangeably,. Density values used here have units of grams per cubic centimeter (gm/cc), specific gravity is numerically the same but has no units.

The disadvantage to RAD-PAK® shielding is the package has to be individually designed and prefabricated for specific customized packages and applications and have to be prepared differently based on whether they are permanently brazed to the ceramic or soldered on as a lid. Long lead times and expensive customized tooling are a consequence of these requirements. They are not usually suited to attaching to finished devices. There is therefore a need for a material that would overcome these limitations. The approach taken here is to use a thick film paste that would adhere to and conform to any device. Optimizing of the paste includes maximizing the content (mass) of the high "Z" material in the paste to maximize the density of the resultant shield. (Where "Z" refers to the atomic number. In the "Art", high Z refers to elements with atomic numbers greater than roughly 40.) The vehicle supports the high "Z" powder and eventually bonds the mass in place on the package or device. The vehicle has to have other desirable properties which will be discussed later.

The usual processing of refractory powdered metals involves high temperatures and pressures. Obviously this is not compatible with electronic devices so a different approach has to be taken. The most obvious way is to mix the powder in a liquid suspension that later hardens after application. Epoxy is a suitable medium. One problem is that it is usually difficult to add more than about 60 volume percent (v/o) of powder in the resin before it becomes 'too dry' or otherwise unmanageable. The effective density of such a composition would only be less than 12 grams/cc. The most promising shielding effectiveness lies with manipulating the 'packing density' of the "high Z" powder in the resin vehicle to maximize the final density of the composite.

The technical paper entitled "The Advantage of Low Pressure Injection Molding" by Peter Shaffer in Materials Technology - March/April 1993 is a guide in directing the development of high density pastes. Particularly relevant excerpts are reproduced below:

The way to obtaining high particulate loadings is well known [1]. Into an array of closely packed large particles is introduced a quantity of smaller ones of such size that they fit into the interstices between the larger ones. A small amount of an even finer fraction is introduced to fill these smaller voids, and so on, and so on With monosized spheres, the theoretical packing density in a close packed array is 74 v/o (volume percent). Perfect bimodal (to discrete sizes) packing yields a theoretical limit of 86 v/o, trimodal (three modes), 90 v/o. In practice the theoretical 74 v/o is never reached Instead typical powder loadings, almost without regard for their composition, rarely exceed about 60 v/o.

For an ideal four component packing system, the diameter ratios have been determined to be 316:38:7:1 [1 ] This is frequently simplified to the rule of 7, each size differing from that of the next larger by a actor of seven The relative volume ratios were determined to be approximately 61:23:10:6. These determinations r made on near perfect-spheres of very narrow size ranges.

Relatively Zings obtaining the high particle loadings is the easy part, making the system sufficiently fluid to flow is not The particles must be fully dispersed and all agglomerates broken into their individual crystallites. Their surfaces must be fully wetted by the fluid medium Finally, the suspension must be stabilized to prevent reagglomeration.

The relative viscosities of a range of packing configurations have been calculated as shown in Figure 1—1 [2]. Further it has been demonstrated that at volume fractions over about 70 v/o, the viscosity should be expected to increase dramatically, even in systems having an infinite particle size distribution. In practice, most systems show greater tendencies to high viscosities and dilatancy than these calculations would suggest.

Section 3 Ranking of Powder Size and Shapes

A wide range of powders shapes are available, including spherical, crystalline and irregular. Some have high degrees of agglomeration, some have an inherently wide range of particle sizes, some are fairly uniform in size. As expected, the coarser powders are better than the finer ones Appendix "A"

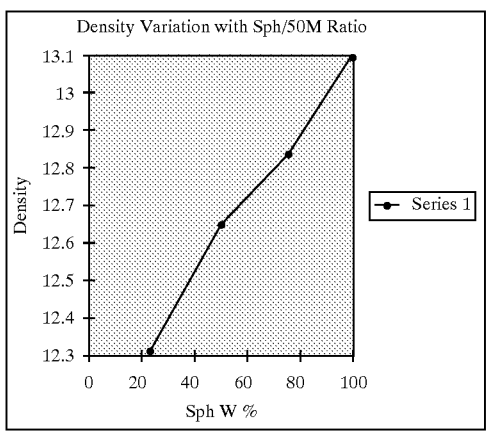

Figure 3–1 Effect of Density of Grade 50M by adding Spheroidal high Z material

The best powder encountered was a fairly coarse spherical powder with a significant proportion of a range of finer powders.

Section 5 Binder Selection

Binders appear to be interchangeable insofar as the resultant density of the composite (for a particular powder) is concerned. The nature of the binder does influence some other properties as will be discussed later. Epoxies, probably more thoroughly plasticized for fracture toughness may prove to be the best choice and are likely to be NASA approved for the proposed end use. Thermoplastic and thermosetting formulations are often available which adds to the versatility of the system and can be changed to suit the method of application. Preliminary results show that the density/radiation protection performance is not dependent on the binder chemistry. Therefore, any superior resin system can be substituted at any time Latex appeared to have the best overall properties as far as preparation, application and cured properties are concerned. While latex may not be the material of choice since it contains ammonia and water in the uncured state, a suitable synthetic material that is similar in consistency and behavior could be used that would be acceptable for contact with electronic devices.

Section 6 Composite properties

The best results so far from simple mixing of selected powder and resin (with the aid of a fugitive wetting agent) has been a S.G of 13.1 with 10 grams of powder mixed with 0.15 grams of epoxy resin. If the composite had been fully dense, there would have been 79 v/o of metal in the composite and the S.G would have been 15.5. Approximately 12 v/o of voids must therefore be present to account for the measured density value. This powder loading of about 67 v/o resulting from a rather crude manual mixing technique is quite good since the literature cited earlier indicated that it difficult to routinely exceed 60 v/o. Another consideration has to be the electrical properties of the material since it may be in intimate contact with a wire bonded bare die or a package with exposed leads. The high loadings of metallic powder is expected to result in a conductive material from extensive particle to particle contacts, but the epoxy—and latex—based composites have high resistances The silicone—based composites were highly conductive.

If the binder completely wets the "high Z" particles then the lowest free energy state for each particle would be surrounded by a thin film of liquid. This insulating film isolates the "high Z " particles and results in a non-conductive composite. (Externally applied pressure could disrupt this insulating film and force particle to particle contacts). Contact angles greater than zero would result in agglomeration of the particles and conductive paths and this may account for the conductivity of the silicone—based composites. Section 7 Powder Modifications The "high Z" powders can be individually coated to ensure that no particle to particle contacts could occur which would compromise the insulating properties of the composite.

Larger particle sizes which make the denser composites can be coated with thin layers of an insulator without seriously degrading the density of the particles.

Section 8 Application methods

Suitable rheology needs to be maintained while maximizing the particle content of the uncured paste. The easiest application is to pour the paste over the device. A better method would involve putting a dam around the to contain the shape and maintain the appropriate shielding thicknesses. However, not all PWAs requiring shielding may allow the use of dams.

Syringe application is another method. A lower solids paste with a fast evaporating solvent constituent might allow a syringe to be used. Such a formulation may also allow spraying to be used to build up to the required thickness and shape in the same manner gunite is applied.

RAD-COAT™ can be applied to parts on a board, chip-on boards, and to the individual prepackaged or unpackaged components for ionizing radiation shielding.

What is claimed is:

1. A radiation shielding composition comprising:

a binder;

a conformal coating material composed of a matrix of densely packed shielding particles dispersed within the binder to shield ionizing or other radiation; and wherein the conformal coating material is composed of a layer of high Z shielding particles interposed between a pair of layers of low Z shielding particles, wherein each one of the high Z and low Z shielding particles are encapsulated within the binder.

2. The radiation shielding composition of claim 1 wherein one of the pair of layers of the low Z shielding particles is disposed as an electric insulator for an electronic device and the other one of the pair of layers of the low Z shielding particles is disposed as a protective outer layer for the electronic device.

3. The radiation shielding composition of claim 1 further comprising an extender.

4. The radiation shielding composition of claim 3 wherein the extender comprises ketone.

5. The radiation shielding composition of claim 1 wherein a thickness of the layer of the high Z shielding particles is greater than a thickness of one of the pair of layers of the low Z shielding particles.

6. The radiation shielding composition of claim 1 wherein the high Z shielding particles comprise a material selected from a group consisting of: tungsten, platinum, gold, tantalum, osmium, and iridium.

7. The radiation shielding composition of claim 1 wherein the low Z shielding particles comprise a material selected from a group consisting of: copper, nickel, carbon, iron, titanium, silicon, and nitrogen.

8. The radiation shielding composition of claim 1 further comprising a fabric, wherein said binder is a flexible binder.

9. The radiation shielding composition of claim 8 wherein the flexible binder comprises latex.

* * * * *

UNITED STATES PATENT AND TRADEMARK OFFICE
CERTIFICATE OF CORRECTION

PATENT NO.   : 6,455,864 B1
DATED        : September 24, 2002
INVENTOR(S)  : Featherby et al.

It is certified that error appears in the above-identified patent and that said Letters Patent is hereby corrected as shown below:

<u>Title page,</u>
Item [63], Related U.S. Application Data, change "Jan. 3, 1997," to -- Jan. 30, 1997 --; and after "5,635,754" insert -- which is a continuation-in-part of application No. 08/221,506, filed on April 1, 1994, now abandoned --.

Signed and Sealed this

Twenty-second Day of April, 2003

JAMES E. ROGAN
*Director of the United States Patent and Trademark Office*